United States Patent
Timm et al.

(10) Patent No.: US 6,344,844 B1
(45) Date of Patent: Feb. 5, 2002

(54) DIGITAL OSCILLOSCOPE HAVING IMPROVED PEAK DETECT MODE

(75) Inventors: Daniel P. Timm; Scott Allan Genther, both of Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/138,207

(22) Filed: Aug. 21, 1998

(51) Int. Cl.[7] .......................... G09G 5/36; G09G 5/10
(52) U.S. Cl. ........................... 345/134; 345/147
(58) Field of Search .................. 345/134, 440, 345/147; 324/121 R, 621; 327/58, 60; 395/500.01

(56) References Cited

U.S. PATENT DOCUMENTS

| | | | | |
|---|---|---|---|---|
| 4,162,531 A | * | 7/1979 | Rode et al. | 324/121 R X |
| 4,251,815 A | * | 2/1981 | Dagostino | 345/134 |
| 4,940,931 A | * | 7/1990 | Katayama et al. | 324/121 R |
| 5,245,324 A | * | 9/1993 | Jonker et al. | 345/134 |
| 5,255,365 A | * | 10/1993 | Hungerbuhler | 345/507 |
| 5,499,190 A | * | 3/1996 | Takahashi et al. | 324/621 X |
| 5,530,454 A | * | 6/1996 | Etheridge et al. | 345/134 |
| 5,548,232 A | * | 8/1996 | Yamaura et al. | 327/60 |
| 5,740,064 A | * | 4/1998 | Witte et al. | 324/121 R |
| 6,016,389 A | * | 1/2000 | Crookham et al. | 395/500.01 |

* cited by examiner

*Primary Examiner*—Matthew Luu
*Assistant Examiner*—Chanté Harrison
(74) *Attorney, Agent, or Firm*—Patrick J. Murphy

(57) ABSTRACT

The present invention is generally directed to a digital oscilloscope and associated method that provides a peak detect mode of operation that not only accurately displays peak information, but also reflects the significance of peak information, without distorting a statistical view of the signal. In this regard, and in accordance with one aspect of the invention, the oscilloscope includes an analog to digital (A/D) converter configured to periodically sample an input signal and convert the periodic samples into a train of digital data. A circuit is disposed at the output of the A/D converter and is configured to evaluate the train of digital data over a first predetermined period of time and detect a minimum value and a maximum value during the first period of time. A mechanism is configured to evaluate the minimum and maximum values and determine a significance measure of the minimum value and the maximum values. Finally, the oscilloscope includes a display controller configured to vary an intensity of a signal representation on a display, in response to the significance measure.

17 Claims, 7 Drawing Sheets

DIGITAL OSCILLOSCOPE HAVING IMPROVED PEAK DETECT MODE

BACKGROUND OF THE INVENTION

1. Field of the Invention

The present invention generally relates to digital oscilloscopes, and more particularly to a digital oscilloscope having an improved peak detect mode of operation.

2. Discussion of the Related Art

Oscilloscopes have been used for years for a number of purposes, including monitoring waveforms of various data, among other purposes. They have become an essential for research, development, and manufacturing of electronic devices. Analog oscilloscopes provide a continuous time-based display of the instantaneous amplitude values of electrical phenomena, and are thus able to accurately display the waveforms of complex signals, such as high-frequency carrier signals having low-frequency envelopes. Analog oscilloscopes, however have a significant disadvantage in that they are unable to store signal waveforms. Also, when viewing very fast signal components, it is difficult to view spikes or glitches due to the dim scope illumination.

With the progress of digital technology, digital oscilloscopes have been developed allowing them to store signal waveforms. Digital oscilloscopes chop input signals into discrete time points determined by an internal clock, quantize the instantaneous amplitude values at those points, and store the resulting digital representations in a digital memory. The display is regenerated from memory at a predetermined clock rate, and is manifested either as a series of dots, or connected dots (i.e., vector mode). Since the input signals are not functionally related to the internal clock of the digital oscilloscope, whatever the instantaneous value of the input signal happens to be when the clock edge occurs is what gets stored.

To address this shortcoming, digital oscilloscopes typically include a "peak detect" mode of operation. In this mode, an analog input signal is sampled at high speed, and converted into digital data by an A/D converter. Maximum peak amplitudes (or maximum and minimum values) of the digital data in a predetermined time period are sequentially stored in memory for later retrieval and display. In this manner, high frequency noise or narrow signal glitches, which are virtually impossible to be detected by general sampling technology, can be detected and stored for later retrieval and display. With a peak detect mode of operation, signal envelopes can be measured, and aliasing can be detected. The detection and storage of peak values (both maximum and minimum) is known and understood by those skilled in the art.

However, one problem that results from peak detection is that it exaggerates noise in the signal, including noise internal to the digital oscilloscope, and displays worst case noise performance. This is because any noise peaks occurring anywhere on the waveform are likely to be acquired and the worst case noise performance is displayed. While sometimes this worst case noise is the information desired, it often masks desired statistical information. For this reason, Peak Detect is a special mode on many digital oscilloscopes, and is often enabled (or selected) only when needed. Another shortcoming of Peak Detect mode is that it typically loses statistical information in the waveform.

As is known and taught in U.S. Pat. No. 5,740,064, assigned to the assignee of the present invention, the exaggerated noise shortcoming in the Peak Detect mode may be addressed by a mechanism that selectively displays either the actual sampled and decimated data or the peak data, during a decimation period. By way of strict, traditional definition, a decimated data point every nth data point, where there are n data points in a decimation period (usually one display pixel column). A "dithered" data point refers to one of every n data points. A dithered data point may be every nth sample point, or it may simply be one (statistically) of every n sampled points. Unless expressly stated as every nth data point, the term decimated data point (or value), as used herein, will refer to one of every n data points. In this regard, the term decimated data point, as used herein, will generally be synonymous with dithered data point.

In keeping with the discussion, the actual sampled (and decimated) data is usually displayed. However, when the difference between the maximum and minimum peak values in a given decimation period exceeds a predetermined threshold (indicating a significant short-term change), then the peak data is displayed. In this way, baseline noise is not exaggerated, but significant signal glitches are captured and displayed.

More specifically, the peak detect technique of U.S. Pat. No. 5,740,064 includes the step of processing a series of digital signal samples through a decimator to extract a decimated sample value from each decimation period. The series of digital signal samples is simultaneously processed through a digital peak detector to extract maximum and minimum values (peak detect sample values) from each decimation period. For a given decimation period, a difference between the maximum and minimum sample values for the interval is calculated. If the difference exceeds a glitch detect threshold value, the maximum and minimum sample values for the given decimation period are transferred to a video sample memory. If not, the decimated sample value for the given decimation period is transferred to the video sample memory.

While the system disclosed in U.S. Pat. No. 5,740,064 effectively de-emphasizes baseline noise, further improvement is desired. In this regard, the system of U.S. Pat. No. 5,740,064 displays either the sampled, decimated values or peak values, for a given decimation period. Consequently, one of these values is neglected (i.e., not displayed) for each decimation period. Thus, some information, which may be valuable to a user, is being withheld. In addition, the threshold of this method adds distortion when plotting signal components of magnitude close to the threshold.

Accordingly, it is desired to provide an improved digital oscilloscope having a peak detect mode that overcomes the shortcomings mentioned above.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a digital oscilloscope that provides a peak detect mode of operation that not only accurately displays peak information, but also reflects the significance of peak information. In this regard, and in accordance with one aspect of the invention, the oscilloscope includes an analog to digital (A/D) converter configured to periodically sample an input signal and convert the periodic samples into a train of digital data. A circuit is disposed at the output of the A/D converter and is configured to evaluate the train of digital data over a first predetermined period of time and detect a minimum value and a maximum value during the first period of time. A mechanism is configured to evaluate the minimum and maximum values and determine a significance measure of the minimum value and the maximum values. Finally, the oscilloscope includes a display controller configured to vary an intensity of a signal representation on a display, in response to the significance measure. Additionally, it is assumed that a mechanism is provided that can also plot a statistically valid view of the sampled waveform, resulting in a composite view that includes both peak and statistical information. In this regard, this composite view may be formed by adding the individual intensities of the peak and statistical view intensities. Alternatively, it may simply pick the brightest intensity, as between the peak view intensity and the statistical view intensity, and plot the composite view at that brightest intensity.

In operation, the oscilloscope samples an electric signal at a periodic sample rate. For a given decimation period, which typically comprises a plurality of sample points, the scope saves the maximum and minimum values (i.e., peak information) of the signal. Assuming that the oscilloscope is operating in vector mode, wherein consecutive points are connected, the oscilloscope displays not only the decimated data points in each decimation period, but also the peak data as well. An important aspect of the present invention, however, is that the peak data is not displayed in such a fashion as to emphasize noise. In this respect, peak data is displayed with a varying display intensity, such that the lower the significance measure of a peak value, the lesser the intensity. The significance measure of a peak value (i.e., max/min values of a decimation period) may be determined in a number of different ways, and may be based on a number of different factors. For example, the peak values may be compared to the other sampled values in that decimation period. If the peak values differ by a large amount, then they may be deemed as either more significant, or less significant, depending upon the mode of operation. Similarly comparisons may be made by comparing the peak values against peak values in neighboring decimation periods.

As will be better appreciated from the detailed description that follows, the present invention enjoys several advantages over the systems known in the prior art. For example, the oscilloscope of the present invention preserves the peak information for all decimation periods, yet displays that information in such a way (e.g., variable intensity) that noise is not amplified and statistical information is displayed and not obscured by peak information, where the peak information does not add significant new information. The invention may be configured to emphasize narrow events and level transitions, which characteristics have traditionally been difficult to see on analog scopes, or even digital scopes in dots rendering mode.

In accordance with another aspect of the invention, a method is provided for implementing a peak detect mode of operation on a digital oscilloscope. In accordance with this aspect of the invention, the method includes the step of converting an input signal into a train of digital data. The method then evaluates the train of digital data over a first predetermined period of time and detecting a minimum value and a maximum value during the first period of time.

Then, the method determines a significance measure of the minimum value and the maximum value. Finally, the method displaying the peak value (or min/max) on a display of the oscilloscope. Preferably, this displaying step includes varying the display intensity based upon the significance measure of the minimum value and the maximum value.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
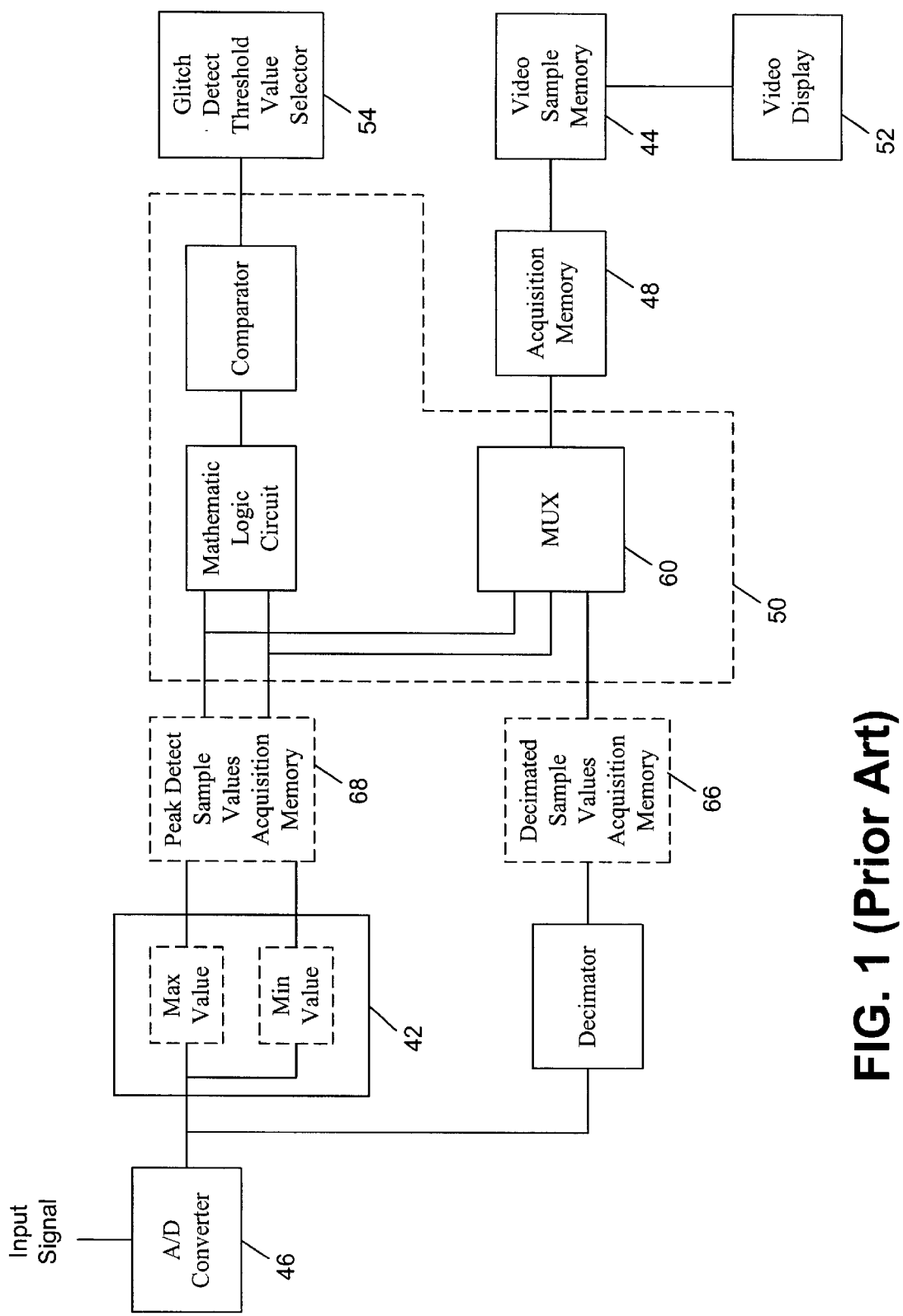
FIG. 1 is a block diagram of peak detect circuitry of a digital oscilloscope as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

While U.S. Pat. No. 5,740,064 has been briefly discussed above, reference is now made to FIG. 1, which is a block diagram of a peak detect circuit disclosed therein. Specifically, that device disclosed a glitch detect threshold circuit 50, which functions as follows. Min/max sample data is received from the outputs of the digital peak detector 42 so that a difference between the maximum and minimum sample values of each decimation period may be calculate. Once calculated, the min/max differences are compared to a specified glitch detect threshold value (GDTV). If the min/max difference of a given decimation period exceeds the GDTV 54, the min/max sample data for that interval is stored in a sample acquisition memory 48. For a min/max difference of a given decimated sample, comparator 54 outputs a signal which is indicative of whether the min/max difference of a decimation period exceeds the GDTV. This signal is received as the multiplexer's 60 select input (SEL). If the select input indicates that a min/max difference exceeds the GDTV, the multiplexer data lines carrying minimum and maximum sample values are fed to the acquisition memory 48. If the select input indicates that a min/max difference does not exceed the GDTV, a multiplexer data line carrying decimated sample values is connected to the acquisition memory 48. Operation of the decimator, digital peak detector, and glitch detect threshold circuit is synched via appropriate clock signals (not shown since their implementation is understood by those skilled in the art).

The first preferred embodiment of the technique of U.S. Pat. No. 5,40,064 concludes as the contents of the acquisition memory 48 are transferred to a video sample memory 44 for display on a video display 52. In the first embodiment, data is first processed through the glitch detect threshold circuit 50, and then stored to memory 48. This may be referred to as a "decide-then-store" approach. In one embodiment of the sampling technique, data is first stored to memory 66, 68 and then later processed through the glitch detect threshold circuit 50 (a "store-then-decide" approach). In another embodiment, the sample acquisition memory 48 which follows the glitch detect threshold circuit 50 may be replaced with a pair of acquisition memories 66, 68 (shown in dashed line) disposed in front of the glitch detect threshold circuit 50.

The reason for using a "store-then-decide" approach, thus requiring both a decimated sample values acquisition memory 68 and a peak detect sample values acquisition memory 66, is to accommodate A/D converters 46 which operate at very high clock speeds. When using a very high-speed A/D converter 46, signal samples may be acquired and stored much faster than the glitch detect threshold circuit 50 can process them. If the additional data processing which occurs in the glitch detect, threshold circuit 50 were to be performed as a signal was being acquired, it would interfere with the fast, efficient acquisition of samples. By first storing the decimated and min/max sample data to memory 66, 68, data can be processed by the glitch detect threshold circuit 50 between sample set acquisitions, thus increasing a wave measuring instrument's overall efficiency. If desired, the decimated and peak detect sample value memories 66, 68 may merely comprise divisions of a single memory.

Although both methods are valid and either may be utilized in connection with the present invention, a "store-then-decide" approach requires twice as much sample acquisition memory as a "decide-then-store" approach. Since memory is costly, instruments which do not incorporate high-speed A/D converters 46 can eliminate use of the additional memory, process data through the glitch detect threshold circuit 50 as it is acquired, and store a reduced size sample data set in a single sample acquisition memory 48. The content of the acquisition memory 48 may be transferred to a video sample memory 44 between the acquisition of consecutive sample sets.

However, and as previously mentioned, the system of FIG. 1 has a limited information display. In this regard, for a given decimation period, it displays (plots) either peak information or decimated (sampled) information, but not both. When peak data is displayed, then noise and other extraneous signals are amplified and statistical information is lost. When decimated information is displayed, then certain statistical information is displayed and peak information is lost.

Figure 2:
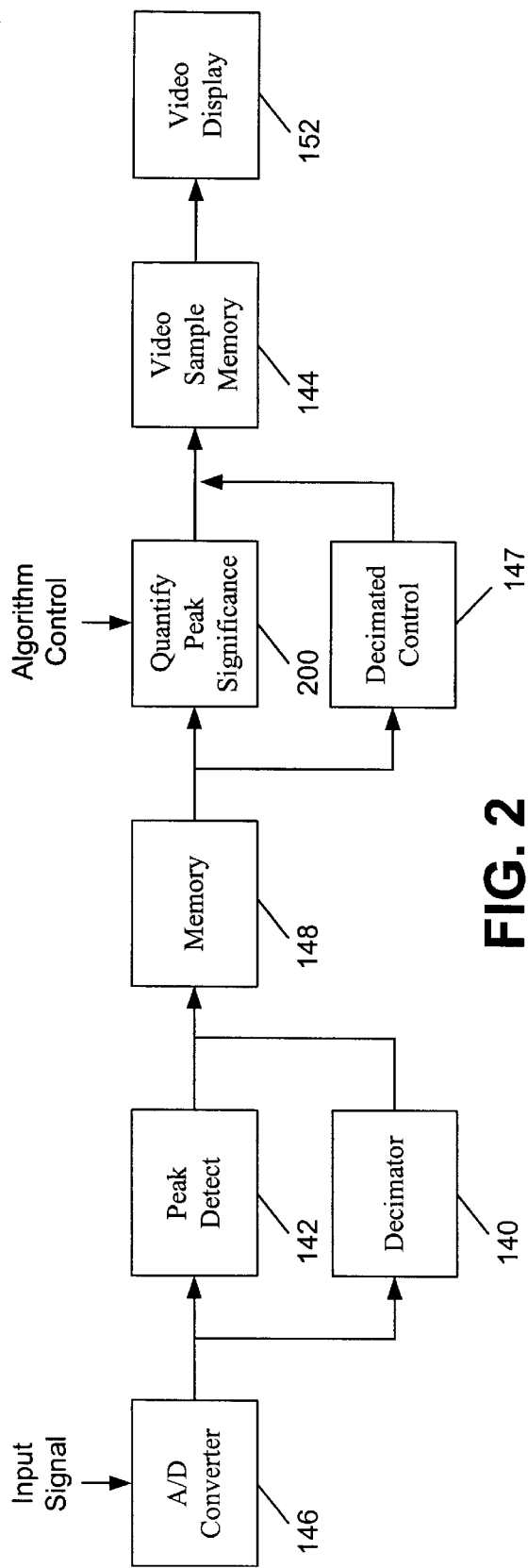
FIG. 2 is a block diagram of peak detect circuitry of a digital oscilloscope constructed in accordance with the present invention.

Reference is now made to FIG. 2, which shows a block diagram of a portion of a circuit for implementing a peak detect mode in a digital oscilloscope. In this regard and consistent with the concepts and teachings of the invention, the circuit may be configured primarily in hardware, software, or any appropriate combination of the two. Certainly, as will be appreciated by those skilled in the art, a predominately software implementation will generally be easier to implement, but will not perform as fast as a predominately hardware implementation. Therefore, the actual implementation may depend upon the sample rate and desired speed of operation of the device. The block diagram of FIG. 1, and the discussion herein, is generally independent of any specific implementation.

As shown in FIG. 2, and consistent with the description provided in connection with FIG. 1, an A/D converter 146 receives an analog input signal and converts that input signal into a train of digital values. These values are then input to both a decimator 140 and a peak detect circuit 142. In a manner that is known and understood, the decimator 140 may extract every nth sample of the A/D and discard all other samples, or it may alternatively extract one of every n samples of the A/D and discard all other samples. In contrast, the peak detect circuitry 142 evaluates every sample and maintains the maximum and minimum values for a given decimation period. The decimated values and the peak values are then stored in memory 148. Alternatively, in a more memory intensive approach (e.g., a store then decide approach), all sampled values could initially be stored in memory 148, then later decimated.

Based upon the decimated values and peak values, the present invention operates to quantify a peak significance measure to the peak values (block 200). In this regard, and as will be discussed in more detail below, a variety of factors may be considered in computing this peak significance measure. To this end, an input, denoted at "algorithm control" is illustrated in the drawing. As will be described below, the significance measure may be calculated in accordance with any of a number of algorithms. The particular algorithm implemented may be selected automatically, or may be selected based upon manual controls that are provided to the user.

The significance measure calculated in block 200, along with the decimated and peak data values, is then directed to a video sample memory 144, which controls the image rendered on a video display 152. Consistent with the invention, the video display 152 may be a cathode ray tube (CRT), a liquid crystal display (LCD), or any other suitable display. In accordance with the preferred embodiment of the invention, both decimated values and peak values are displayed on display 152. In accordance with the inventive concepts, however, the peak data values are generally displayed in a manner that allows a user/viewer to discern the significance of the values displayed. Preferably, this significance is displayed by way of varying the display intensity. The greater the significance of a peak value, the brighter its intensity will be on the display. Conversely, the lower the significance of a peak value, the dimmer its intensity will be on the display 152.

A "Decimated Control" block 147 is illustrated as being in parallel with the "Quantify Peak Significance" block 200, and operates to take the decimated data from memory 148 and generate a statistically valid view of the data. The operation of this block 147 will be appreciated by those skilled in the art, and it need not be described herein, as it does not form part of the present invention.

Figure 3:
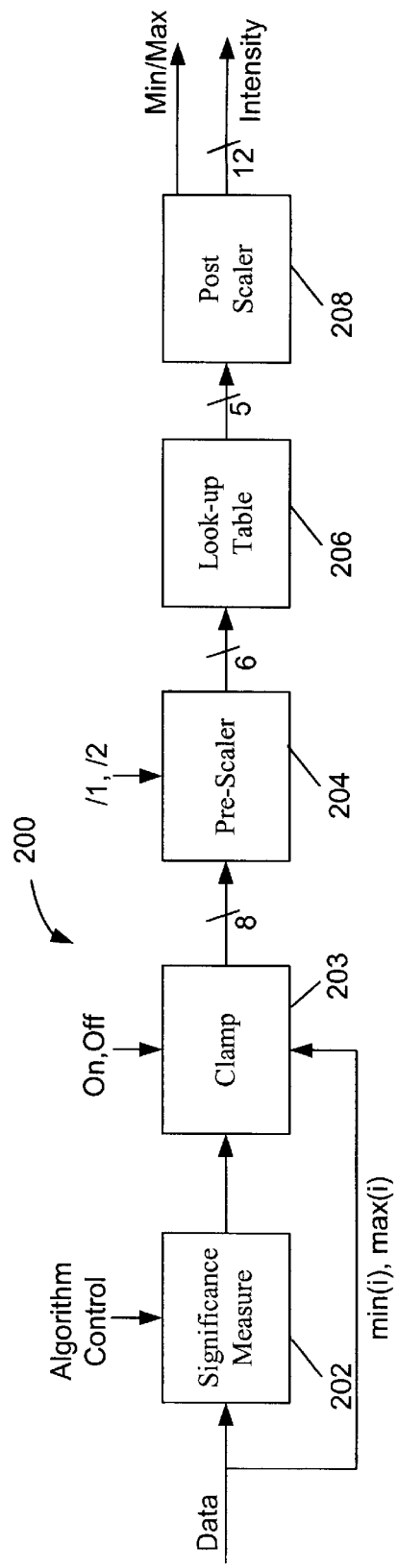
FIG. 3 is a block diagram showing a more detailed illustration of the computation of a significance measure and display intensity adjustment of the present invention.

Reference is now made to FIG. 3, which shows a block diagram of the significance quantification block 200 of FIG. 2, as implemented in accordance with one embodiment of the invention. In this regard, data (including both peak data and decimated data) is input to a significance measure block 202. The significance measure block 202 computes a significance measure for the peak data values (for a given decimation period) in accordance with any of a number of algorithms, a few of which will be discussed below.

The output of the significance measure block 202 is directed to a clamp block 203 (which may be turned ON or OFF), which is configured to prevent over-emphasis of the significance measure. In this regard, several of the algorithms discussed below incorporate span differences, comparing against values of neighboring decimation periods. Such algorithms, however, can overstate the significance of, for example, the top or base of a digital pulse in certain circumstances. A simple clamping of the significance measure can prevent this from occurring. Since details of the clamping function itself do not form part of the broad concepts of the invention, no further discussion need be provided herein. With the foregoing recognition of the problem and the broad solution, one of ordinary skill in the art will appreciate various ways of specifically implementing the clamping function.

Figure 7:
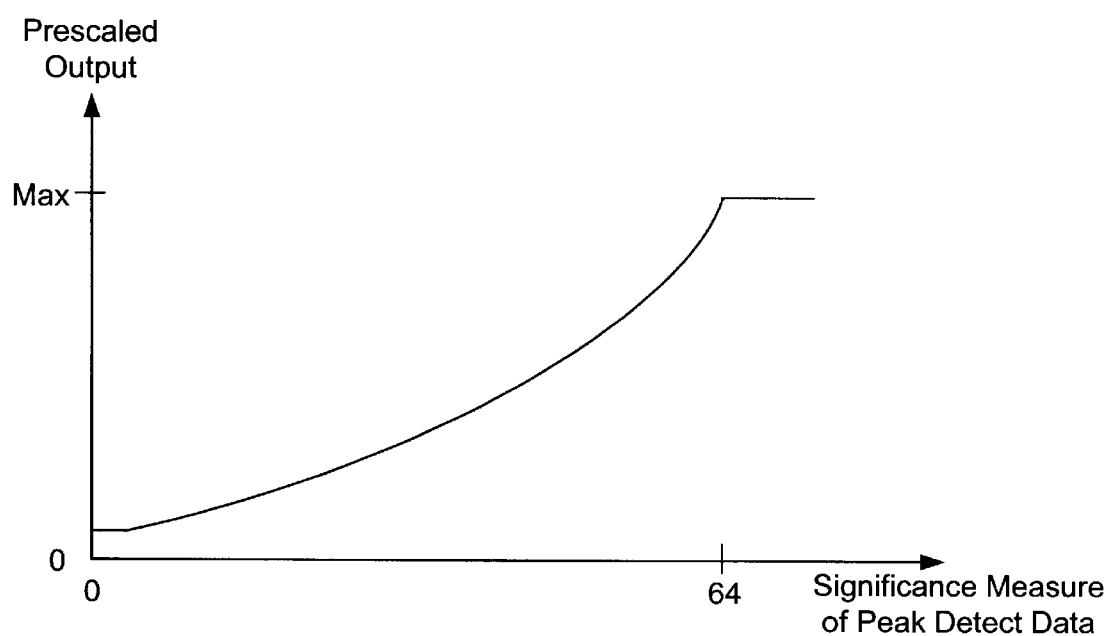
FIG. 7 is a graph illustrating the values stored in a look-up table that is used to translate a significance measure into an intensity.

The output of the clamping block 203 is directed to a pre-scalar block 204. The pre-scalar block allows for changing of intensity of a larger range than sixty-four. In this regard, a look-up table 206 defines sixty-four entries that translate the significance measure into an unscaled intensity, to be plotted as one stroke between max and min for a given decimation period, typically equal to one display pixel column. As shown with brief reference to FIG. 7, which is a graphical plots the data that is stored in the look-up table 206 for the prescaled intensity vs. significance measure, the intensity is generally linear, but the look-up table 206 allows for some flexibility. It will be appreciated that this function may be implemented in a computational fashion, instead of in a lookup fashion. It should further be appreciated that the pre-scalar block 204 and post-scalar blocks 208 have been implemented in the preferred embodiment in order to reduce the size of the look-up table, and these blocks are not necessary to implement the broader function and concepts of the present invention.

Returning to the pre-scalar block 204, an input (which may either be a zero or a one) allows for a divide by two feature. More particularly, if the input is selected to invoke this feature, the significance measure allows a linear range of behavior to spans of the order of one hundred twenty eight vertical codes (rather than sixty four). Although this feature will generally not be required, it provides a relatively simple, low-cost solution when an intensity range of greater than sixty-four codes is needed.

Finally, a post-scalar 208 operation is provided. This block scales the intensity output from the look-up table 206. As illustrated, the data path input to the post-scalar block 208 is preferably five bits in width. The data path of output from the post-scalar block 208 is preferably twelve bits wide. Accordingly, the resulting stroke intensity can be scaled to almost any arbitrary range. This is desired so that the peak strokes are not overwhelmed by the intensity of the decimated or dithered data. The ratio of dithered data points plotted to peak data points plotted is generally variable. For example, assume that the oscilloscope is set on a sweep speed that results in 50,000 dithered points plotted, and that this is fifty dithered points per min/max pair. If there was not a method to allow the intensity of the one peak stroke to be scaled, it could be overwhelmed by the intensity from the fifty dithered data strokes.

Figure 4A:
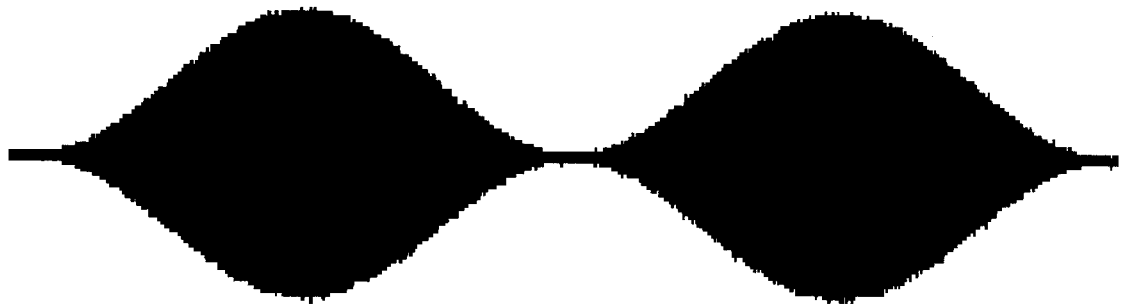
FIG. 4A is a graph of an amplitude modulated waveform as displayed by a peak mode oscilloscope display of a prior art system.
Figure 4B:
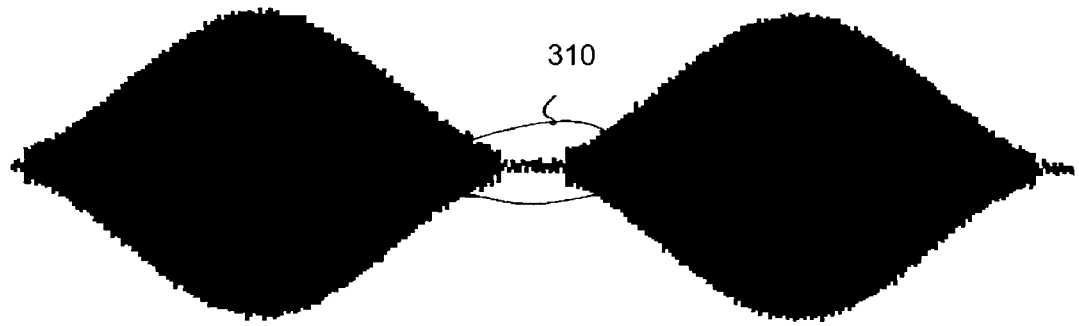
FIG. 4B is a graph of an amplitude modulated waveform as displayed by a peak mode oscilloscope display of a prior art system like that disclosed in U.S. Pat. No. 5,740,064.
Figure 4C:
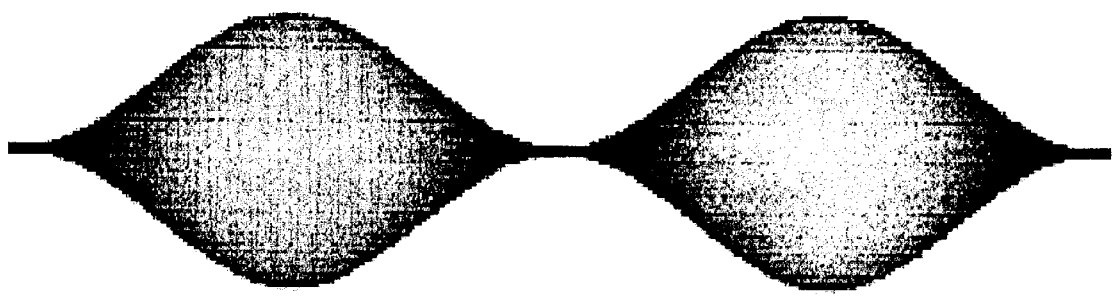
FIGS. 4C is a graph of an amplitude modulated waveform as displayed by an peak mode oscilloscope constructed in accordance with the invention.

Reference is now made to FIGS. 4A–4C, which illustrate the operation of the present invention in connection with an amplitude modulated waveform. More particularly, FIG. 4A is a graph illustrating a display of a peak detect mode of an oscilloscope of the prior art. In this graph, the envelope of the sine wave, as well as the interior space defined by its envelope, is displayed with a relatively uniform intensity. This illumination of the interior space results from samplings taken of the signal modulated on the sine wave. Thus, with the uniform intensity display, much of the statistical information about the modulated waveform is lost. For example, one could not discern whether the carrier signal is a sine wave or a square wave.

FIG. 4B illustrates a graph of an oscilloscope display operating in the peak detect mode disclosed in U.S. Pat. No. 5,740,064. As illustrated at reference numeral 310, a step is observed near the glitch-threshold-amplitude crossing. As previously described, the system of that patent displays either decimated or peak data for each decimation period (depending upon whether the peak data exceeds a threshold value). The step discontinuity 310, also known as artifact distortion, results from a transition between the display of peak data and the display of decimated data As also observed from FIG. 4B, statistical information is lost from the relatively uniform intensity of the displayed waveform.

To illustrate the display presented by the present invention, reference is now made to FIG. 4C. In this regard, and as shown, an oscilloscope constructed in accordance with the invention displays a similar waveform. However, it displays the sine wave envelope with greater intensity than it displays the interior space. In this regard the carrier waveform (i.e., the sine wave envelope) embodies statistical information, and is therefore displayed (preferably) with greater intensity that the interior space within the envelope. Also, artifact distortion is eliminated. For illustration purposes, the intensity here is represented by dot density.

Figure 5A:
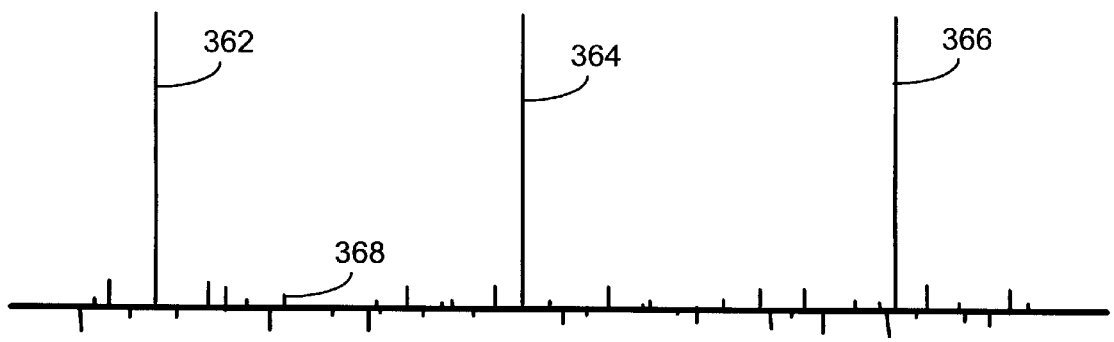
FIG. 5A is a graph illustrating the display of peak data of a periodic signal pulse, using a peak detect mode as known in the prior art.
Figure 5B:
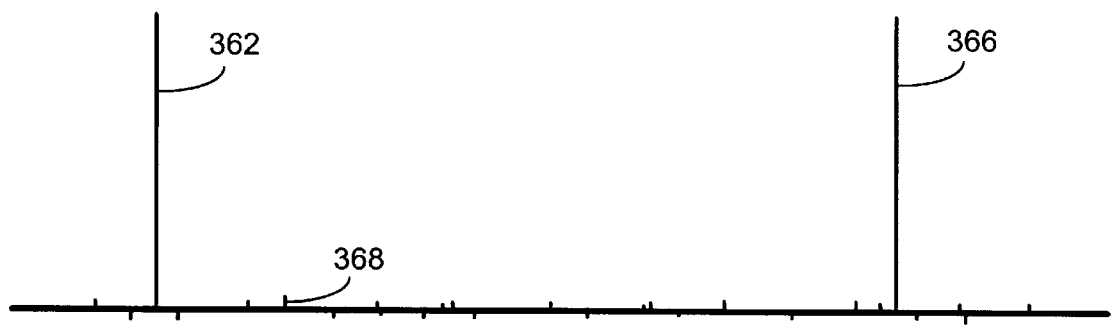
FIG. 5B is a graph illustrating the display of decimated values of the periodic signal pulse of FIG. 5A, as is known in the prior art.
Figure 5C:
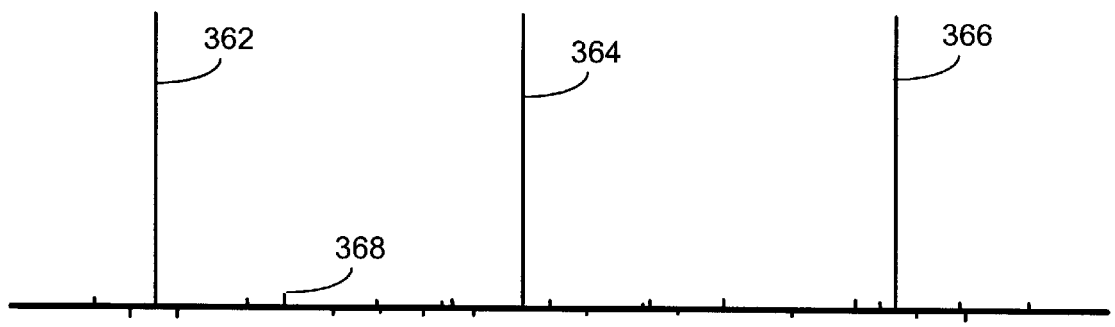
FIG. 5C is a graph illustrating the display of both the peak and decimated values of the periodic pulse of FIG. 5A, as in known in the prior art.
Figure 6A:
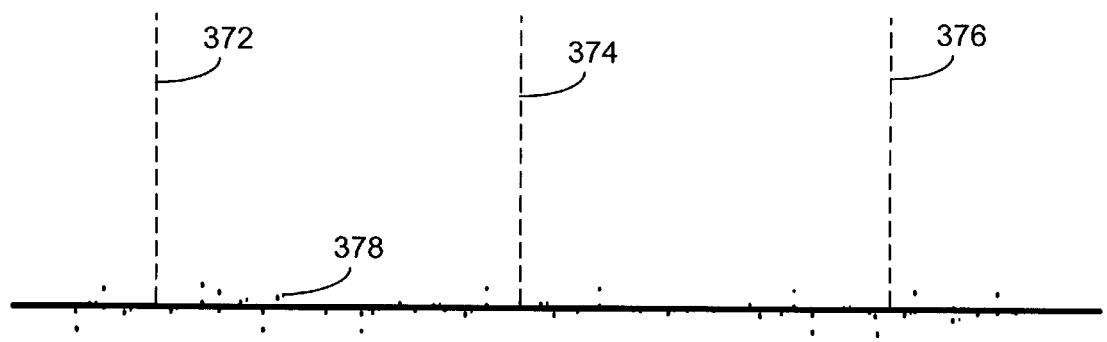
FIG. 6A is a graph illustrating the display of peak data of a periodic signal pulse using the peak detect mode of the present invention.
Figure 6B:
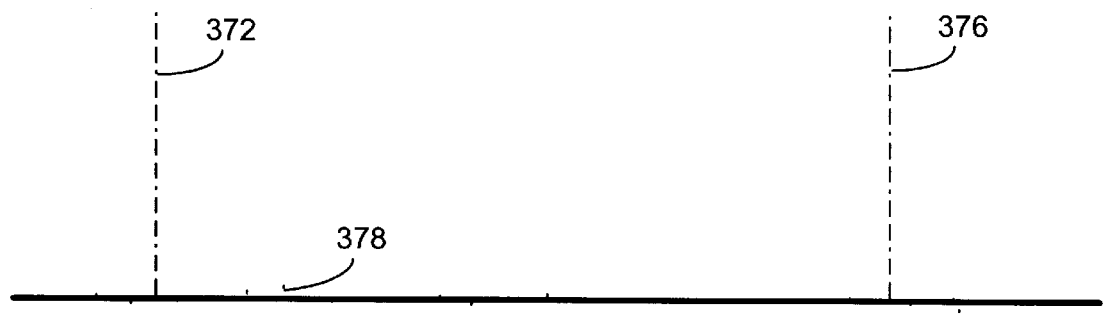
FIG. 6B is a graph illustrating the display of decimated values of the periodic signal pulse of FIG. 6A, in accordance with the present invention.
Figure 6C:
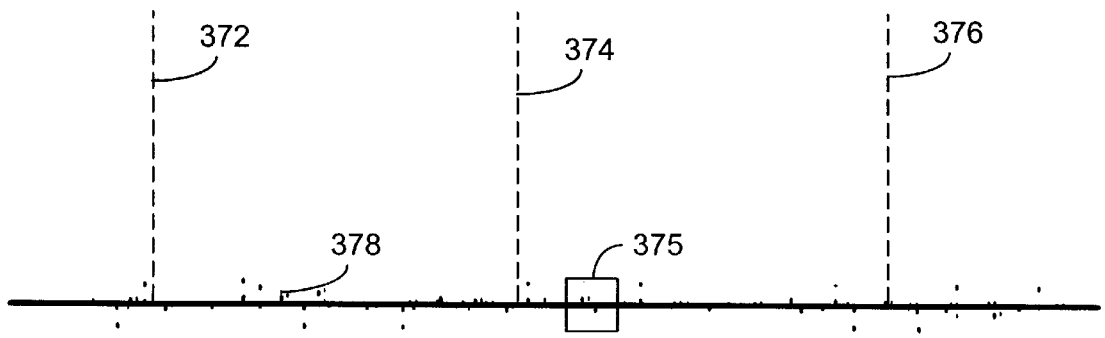
FIG. 6C is a graph illustrating the display of both the peak and decimated values of the periodic pulse of FIG. 6A, in accordance with the present invention.

Reference is now made to FIGS. 5A–5C and 6A–6C, which, collectively, present another example illustrating the present invention. In this regard, FIGS. 5A–5C are graphs that illustrate a peak detect display (FIG. 5A), a decimated only display (FIG. 5B), and a simultaneous display of both peak and decimated data (FIG. 5C), as is known and done by oscilloscopes of the prior art. In contrast, FIGS. 6A–6C are graphs that illustrate a peak detect only display (FIG. 6A), a decimated only display (FIG. 6B), and a simultaneous display of both peak and decimated data (FIG. 6C), as is performed by an oscilloscope constructed in accordance with the present invention.

To illustrate the operation of the present invention in connection with a more realistic waveform, the waveform selected for these figures is a periodic pulse 362, 364, and 366, of relatively large amplitude, but extremely narrow time duration. The actual time duration of the pulse may vary, but it is extremely narrow with respect to the time period selected for display on the scope. In this respect, the width of the actual pulse is less than the time between decimated samples, and therefore may or may not be sampled and displayed in a decimated only display. It will be appreciated that if the pulse were larger in time duration than the time between decimated samples, then it would always be displayed, as it would be sampled by at least one. It will be further appreciated, however, if the pulse is at least the width of the maximum sampling period (as opposed to the decimation period) of the A/D of the oscilloscope, it is assured of being displayed in peak mode. Otherwise, the pulse could be so brief that it may fail to occur at a sample point at the maximum sample rate, and therefore be missed altogether.

In keeping with a brief description of the figures, FIG. 5A illustrates three periodic pulses 362, 364, and 366 displayed by a digital oscilloscope operating in Peak Detect mode. It also depicts aperiodic baseline noise (e.g., 368), which will typically be detected and displayed in such an operational setting. As can be seen, the pulses, as well as the baseline noise are all displayed with the same intensity, and therefore, statistical information carried in the signal is lost in the display.

FIG. 5B illustrates a prior art decimated display of the same periodic waveform. Unlike the display of FIG. 5A, peak information is lost and more statistical information is preserved. Due to the extremely narrow time period of the pulse (e.g., less than a decimated sample period), a decimated display is not guaranteed to display every pulse that occurs. In the illustration of FIG. 5B, pulse 364 is lost in the decimated display.

Finally, FIG. 5C illustrates a prior art display of an oscilloscope that is capable of selectively displaying peak data or decimation data for every decimation period. It displays statistical information for the baseline noise, and yet does not miss pulse 364.

Reference is now made to FIGS. 6A–6C, which illustrate graphs of a similar waveform, as they are displayed on an oscilloscope constructed in accordance with the present invention. In this regard, three pulses 372, 374, and 376 are displayed in both the graph of the Peak Detect only mode (FIG. 6A) and the graph that displays both peak information (min/max pairs) and decimated information for each decimation period (FIG. 6C). Like FIGS. 5A–5C, baseline noise 378 is also detected and displayed. Note that an enlarged view of the boxed portion of the graph shown in FIG. 6C, represented by reference numeral 375, is shown inf FIG. 9. Also, just as in FIG. 5B, in the decimated display of FIG. 6B, one of the pulses 374 is not displayed (as it did not coincide with that particular decimated sample). Note also that the peaks displayed in FIG. 6B are dimmer than the peaks displayed in FIG. 6A.

In contrast to FIGS. 5A–5C, the display of data on an oscilloscope constructed in accordance with the present invention does not over-emphasize baseline noise. Also, it preserves (and displays) statistical information. In this regard, the intensity of the pulses 372, 374, and 376 is less (i.e., dimmer) than that of the pulses 362, 364, and 366 displayed in FIGS. 5A–5C. This lesser intensity is illustrated herein by dashed lines, instead of solid lines. Note, however, that pulses 372, 374, and 376 in FIGS. 6A and 6C are brighter than the peaks of baseline noise, because they are more significant.

It will be appreciated, that the intensity of the pulses may vary, consistent with the inventive concepts, depending upon a number of factors. Certainly, a manual display intensity control may be provided to allow a user certain intensity control. This will allow a user to increase and decrease the intensity of all signals displayed on the display by equal amounts. However, the relative intensities, as determined by one embodiment of the present invention, will not be altered by the adjustment of a manual control.

Also, and consistent with the invention, it will be appreciated that the relative intensity of different signals may be varied depending upon the algorithm implemented by an oscilloscope constructed in accordance with the present invention. In this regard, and consistent with the invention, various algorithms may be implemented. Indeed, various algorithms may even be selectable on a given oscilloscope, depending upon the display desired at a given time or in evaluating a given signal. As previously mentioned, for each decimation period the invention operates to assign a given signal a significance measure, depending upon the algorithm implemented. It is this significance measure that determines the relative display intensity of the various signals displayed on the display at any given time. For example, although not shown, suppose that pulse 376 was of much lower amplitude than the pulse 372. In such a situation, the system might deem pulse 372 to be of greater significance (depending upon the significance measure algorithm) and thus display it at a greater relative intensity than it displays pulse 376.

Having described the broad aspects and implementation of the present invention, various algorithms will now be discussed for computing the significance measure of block 200 (FIG. 2). It should be appreciated that one or more of the following algorithms may be implemented as a matter of design choice. Alternatively, the system may be configured to automatically and dynamically select one of the algorithms, wherein the selection criteria may vary depending on a number of factors. Alternatively, the active algorithm may be manually selectable by a user of the oscilloscope. Thus, the present invention is not limited to the implementation of any one or more of the following algorithms. Indeed, other algorithms may be implemented consistent with the concepts and teachings of the invention.

In accordance with a first algorithm, the system always plots (in addition to the statistically valid plot) one min/max pair per decimation preiod, and it always plots in the peaks minimum visible intensity value. Data can be made more visible by increasing a manual intensity control, resulting in more readily visible peaks. Advantageously, at a nominal intensity setting, this system doesn't over-emphasize noise, nor does it distort the envelope gray scale information. Furthermore, it treats digital edges consistently. At a full intensity setting, it makes glitches and level shifts easier to notice. It also helps aliased waveforms and helps a level shift to envelope transition. However, peak visibility obscures the statistically valid view.

In accordance with a second algorithm, the system always plots (in addition to a statistically valid plot) one min/max pair per decimation period. In accordance with this second algorithm, the intensity of the peak stroke is proportional to its length or span. As a result, at a nominal intensity setting, this algorithm does not overemphasize small signal noise. It also makes glitches and level shifts easier to notice (if the level shift is large). It also helps aliased waveforms, and helps a level shift to envelope transition. Furthermore, it treats digital edges consistently. However, it distorts envelope information. At a full intensity setting, the system also makes glitches and level shifts easier to notice. It help aliased waveforms, helps level shift to envelope transition, and treats digital edges consistently. However, peak visibility obscures statistically valid views, particularly modulated signals.

In accordance with a third algorithm, the system always plots (in addition to a statistically valid plot) one min/max pair per decimation period. The intensity of the peak stroke is proportional to its significance. To this end, significance can be measured in a variety or ways, but most require some comparison to the peak information of neighboring columns, or to the dithered information for the current pixel column (i). One formulaic expression for such an algorithm may be:

$$\text{Sig(column i)} = \text{MIN}\{|\text{span}(i)-\text{span}(i-1)|, |\text{span}(i)-\text{span}(i+1)|\}$$
$$\text{where Span}(i)=\text{Max}(i)-\text{Min}(i).$$

In accordance with this algorithm, at a nominal intensity setting, the system does not over-emphasize noise. It makes glitches and level shifts easier to notice, and it does not distort envelope gray scale information. At a full intensity setting, the system makes glitches and level shifts easier to notice. It also helps aliased waveforms, helps level shift to envelop transition, and treats digital edges consistently. However, this algorithm can distort pulses that extend over two decimation periods. It does not treat level shifts to envelope transition consistently.

In accordance with a fourth algorithm, the system operates like the third algorithm, except that the formulaic expression for the significance algorithm may be:

$$\text{Sig(column i)}=\text{MIN}\{|\text{span}(i)-\text{span}(i-1)|, |\text{span}(i)-\text{span}(i+1)|\}+\text{trend},$$

where trend=|midpoint (i+1)−midpoint (i−1)|,
where midpoint(i)=(Max(i)+Min(i))/2.

In accordance with this algorithm, at a nominal intensity setting, the system does not over-emphasize noise. It displays level shifts more accurately than previous algorithms. It also makes glitches and level shifts easier to notice, and it does not distort envelope gray scale information. It also helps level shift to envelope transition. At a full intensity setting, the system makes glitches and level shifts easier to notice. It also helps aliased waveforms, helps level shift to envelop transition, and treats digital edges consistently. However, this algorithm can distort pulses that extend over two decimation periods.

In accordance with a fifth algorithm, the system operates like the third algorithm, except that the formulaic expression for the significance algorithm may be:

$$\text{Sig(column i)}-=\text{MAX}\{\text{MinSpan1Column}, \text{MinSpan2Columns}\}+\text{trend},$$

where MinSpan 1 Column is the minimum span difference looking one column away, and MinSpan2Columns is the minimum span difference looking two columns away. Thus, $$\text{MinSpan1Column}=\text{MIN}\{|\text{span}(i)-\text{span}(i-1)|, |\text{span}(i)-\text{span}(i+1)|\},$$

and MinSpan2Column=MIN{ |(2*span(i)−span(i−1)−span(i−2)) /2|,

|(2*span(i)−span(i+1)−span(i+2)) /2|}.

In accordance with this algorithm, at a nominal intensity setting, the system does not over-emphasize noise. It makes glitches and level shifts easier to notice, and it does not distort envelope gray scale information. It also helps level shift to envelope transition, and it treats digital edges somewhat consistently (depending upon neighboring spans and trends). At a full intensity setting, the system makes glitches and level shifts easier to notice. It also helps aliased waveforms, helps level shift to envelop transition, and treats digital edges consistently.

Figure 8:
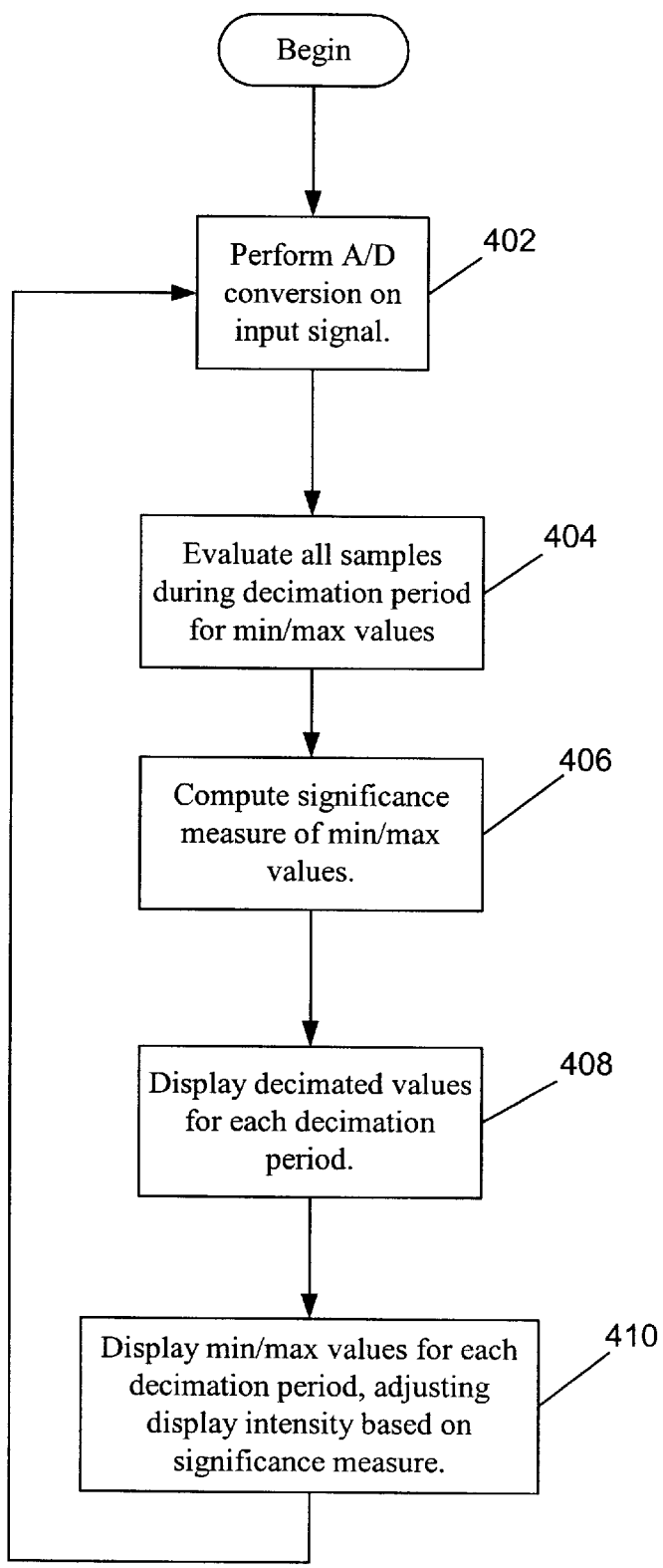
FIG. 8 is a flowchart illustrating the primary steps of implementing a peak detect mode in a digital oscilloscope constructed in accordance with the present invention.

Reference is now made to FIG. 8, which shows a flowchart illustrating the primary steps of implementing a peak detect mode in a digital oscilloscope constructed in accordance with the present invention. In accordance with the invention, the method includes the step of converting an input signal into a train of digital data (step 402). The method then evaluates the train of digital data over a first predetermined period of time and detecting a minimum value and a maximum value during the first period of time (step 404). Then, the method determines a significance measure of the minimum value and the maximum value (step 406). Finally, the method displays both the peak and statistical values on a display of the oscilloscope (steps 408 and 410). In this regard, the method includes the steps of displaying the decimated values for each decimation period (step 408), and displaying the peak values for each decimation period, wherein this step includes varying the display intensity based upon the significance measure of the minimum value and the maximum value (step 410).

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A digital oscilloscope comprising:
    an A/D converter configured to periodically sample an input signal and convert the periodic samples into a train of digital data;
    a circuit configured to evaluate the train of digital data over a first predetermined period of time and detect a minimum value and a maximum value during the first period of time;
    a mechanism configured to determine a significance measure of the minimum value and the maximum value, wherein the significance measure is determined based upon minimum value and a maximum value of a signal in at least one time period, within the train of data, near the first period of time; and
    a display controller configured to vary an intensity of a signal representation on a display, in response to the significance measure.

2. The digital oscilloscope as defined in claim 1, wherein the significance measure is determined based upon a minimum value and a maximum value in a time period immediately preceding the first period of time and a time period immediately following the first period of time.

3. The digital oscilloscope as defined in claim 1, wherein the significance measure is determined based upon a minimum value and a maximum value in a time period immediately preceding the first period of time.

4. The digital oscilloscope as defined in claim 1, wherein the significance measure is determined based upon a minimum value and a maximum value in a time period immediately following the first period of time.

5. The digital oscilloscope as defined in claim 1, wherein the significance measure is determined based upon a minimum value and a maximum value in a plurality of time periods immediately preceding the first period of time and a plurality of time periods immediately following the first period of time.

6. The digital oscilloscope as defined in claim 1, wherein the mechanism includes an electronic circuit.

7. The digital oscilloscope as defined in claim 1, wherein the mechanism includes executable code for execution in a processing circuit.

8. The digital oscilloscope as defined in claim 1, wherein the display displays the minimum and maximum value for the first period of time, and varies the intensity derived from the minimum and maximum values to convey statistical information.

9. A digital oscilloscope comprising:

means for converting an input signal into a train of digital data-;

means for evaluating the train of digital data over a first predetermined period of time and detect a minimum value and a maximum value during the first period of time;

means for determining a significance measure of the minimum value and the maximum value, wherein the significance measure is determined based upon minimum value and a maximum value of a signal in at least one time period, within the train of data, near the first period of time; and means for varying an intensity of a signal representation on a display in response to the significance measure.

10. A digital oscilloscope having a peak detect mode of operation, the improvement comprising:

a mechanism for evaluating a significance of at least one signal peak data pair during a predetermined period of time, wherein the significance measure is determined based upon minimum value and a maximum value of a signal in at least one time period, within the train of data, near the first period of time; and means for displaying of the at least one signal peak data pair by varying a display intensity in response to the significance measure.

11. The digital oscilloscope as defined in claim 10, wherein the significance measure is determined based upon a minimum value and a maximum value in a time period immediately preceding the first period of time and a time period immediately following the first period of time.

12. The digital oscilloscope as defined in claim 10, wherein the significance measure is determined based upon a minimum value and a maximum value in a plurality of time periods immediately preceding the first period of time and a plurality of time periods immediately following the first period of time.

13. The digital oscilloscope as defined in claim 10, wherein the mechanism includes an electronic circuit.

14. The digital oscilloscope as defined in claim 10, wherein the mechanism includes executable code for execution in a processing circuit.

15. A method for implementing a peak detect mode of operation on a digital oscilloscope comprising the steps of:

converting an input signal into a train of digital data;

evaluating the train of digital data over a first predetermined period of time and detecting a minimum value and a maximum value during the first period of time;

determining a significance measure of the minimum value and the maximum value, wherein the significance measure is determined based upon minimum value and a maximum value of a signal in at least one time period, within the train of data, near the first period of time; and displaying the significance measure on a display of the oscilloscope by varying the intensity of the display in accordance with a magnitude of the significance measure.

16. The method as defined in claim 15, wherein the step of displaying the significance measure includes varying an intensity of the display in response to the significance measure.

17. The method as defined in claim 16, wherein the greater the significance measure, the brighter the display intensity.

* * * * *